United States Patent [19]

Fukuda et al.

[11] 4,144,117
[45] Mar. 13, 1979

[54] METHOD FOR PRODUCING A LITHIUM TANTALATE SINGLE CRYSTAL

[75] Inventors: Tsuguo Fukuda, Yokohama; Hitoshi Hirano, Kanagawa, both of Japan

[73] Assignee: Tokyo Shibaura Electric Co., Ltd., Kawasaki, Japan

[21] Appl. No.: 776,207

[22] Filed: Mar. 10, 1977

[30] Foreign Application Priority Data

Mar. 17, 1976 [JP] Japan .................................. 51-28173

[51] Int. Cl.$^2$ ...................... B01J 17/18; C01G 35/00
[52] U.S. Cl. .................... 156/617 SP; 156/DIG. 87; 156/DIG. 96; 156/DIG. 97; 156/DIG. 83; 75/172E; 432/265; 423/593
[58] Field of Search ................... 252/62.9 R; 432/265; 75/172 E; 156/DIG. 96, DIG. 97, DIG. 83, DIG. 87, 617 SP; 23/273 SP; 423/65, 184, 593

[56] References Cited

U.S. PATENT DOCUMENTS

| | | | |
|---|---|---|---|
| 2,106,527 | 1/1938 | Kostetter | 75/172 E |
| 2,142,660 | 1/1939 | Streicher | 432/265 |
| 2,190,296 | 2/1940 | Richardson | 75/172 E |
| 2,460,547 | 2/1949 | Stevens | 75/172 E |
| 3,370,927 | 2/1968 | Faust | 156/DIG. 97 |
| 3,393,054 | 7/1968 | Rupprecht | 156/DIG. 96 |
| 3,601,639 | 8/1971 | Flaunnon | 252/62.9 |
| 3,681,033 | 8/1972 | Bleil | 156/DIG. 97 |

FOREIGN PATENT DOCUMENTS

| | | | |
|---|---|---|---|
| 1210415 | 2/1966 | Fed. Rep. of Germany | 156/DIG. 96 |
| 1546324 | 10/1968 | France | 156/DIG. 87 |
| 46-14825 | 1971 | Japan | 156/DIG. 87 |

OTHER PUBLICATIONS

Rudd, Bell Lab. Record, May, 1973, No. 4, pp. 14–18.
Nassau, Bell Tele. System, Monograph 5219, 1966, pp. 1–6.
Tien, Applied Physics Letters, vol. 24, No. 10, May 15, 1974, pp. 503–506.
Tien, J. of Voc. Sci. & Tech., vol. 12, No. 4, Jul.–Aug., 1975, pp. 892, 893, 894, 898, 899,900.
Nassau, Bell Tele. System, Monograph 5219, part 2, pp. 1–4, 1966.
Taguchi, Growth and Prop. of LiNbO$_3$ Single Cryst, 1966, pp. 1–11.
Ballman, J. of Cryst. Growth, 29, 1975, pp. 289–295.

Primary Examiner—Stephen J. Emery
Attorney, Agent, or Firm—Flynn & Frishauf

[57] ABSTRACT

A method for producing a lithium tantalate single crystal comprises the steps of preparing a melt consisting essentially of lithium tantalate in a platinum-rhodium crucible including 20 to 40 weight percent of rhodium, and growing a lithium tantalate single crystal from the melt in an oxidizing atmosphere, for example, in the atmosphere.

14 Claims, 7 Drawing Figures

METHOD FOR PRODUCING A LITHIUM TANTALATE SINGLE CRYSTAL

This invention relates to a method for producing oxide piezoelectric materials, and in particular lithium tantalate single crystals.

Lithium tantalate single crystals having a piezoelectric effect are used for an elastic surface wave device etc. Such lithium tantalate single crystals are produced by a single crystal growth method such as a pulling-up method (for example, a Czochralski method), pulling-down method, laterally pulling method. Among these methods, for example, the pulling-up method generally uses a platinum or iridium crucible in which a single crystal is grown from a melt. Since, however, the melting point (1773° C.) of platinum is close to the melting point (about 1650° C.) of lithium tantalate, difficulty is encountered in the production of lithium tantalate single crystals in a platinum crucible. That is, in order to obtain a homogeneous lithium tantalate melt the wall temperature of the crucible needs to be maintained at least about 1850° C. and the crucible is worn due to rapid evaporation of platinum and deformed. For example, several grams of platinum are lost during the production of one single crystal and it is impossible to recover the platinum. The crucible is deformed each time one single crystal is produced. In consequence, the platinum crucible needs to be repaired each etime one lithium tantalate single crystal is produced, or it needs to be replaced by a corresponding new crucible. Since such a high cost platinum crucible can not be used repeatedly, the lithium tantalate single crystal so obtained is fairly high in cost.

For these reasons, such a platinum crucible is hardly used in the production of lithium tantalate single crystals.

An iridium crucible can be satisfactorily used in the production of lithium tantalate single crystal, for the melting point (2450° C.) of iridium is sufficiently higher than of lithium tantalate. The use of an iridium crucible in the production of a lithium tantalate single crystal is reported, for example, by A. A Ballman in J. Amer. Ceram. Soc. 48, 112 (1965) under the title of "Growth of Piezoelectric and Ferroelectric Materials by C. Z. Technique." Upon heating, iridium is oxidized in an oxidizing atmosphere to iridium dioxide, followed by sublimation. For this reason, iridium crucible must be used in a reducing or inert atmosphere. A lithium tantalate single crystal grown in a reducing or inert atmosphere in the iridium crucible often suffers crystal defects such as an oxygen defect, which would not be corrected even by application of a subsequent heat treatment. Because of the presence of such crystal defects the dislocation density of the lithium tantalate single crystal is great, for example, of the order of $10^5$ to $10^6$ lines/cm$^2$ (see Journal of Crystal Growth, 24-25, PP 432 to 436 (1974) and in consequence the strength of the single crystal is lowered, presenting difficulty in the formation of a substrate for an elastic surface wave device, etc. Because of the presence of such crystal defects the lithium tantalate single crystal has a greater dielectric loss and, when applied to an elastic surface wave device, etc., it shows a poor electric power efficiency. Since iridium is very high in cost and a high cost is also involved in the manufacture of an iridium crucible, the unit price of the iridium crucible amounts to 3 to 4 times as that of a platinum crucible. That is, a crucible with a diameter of 80 mm, a height of 80 mm and a wall thickness of 1.5 mm is required in the production of a single crystal of 40 mm in diameter and the unit price of such iridium crucible is about 7,000,000 yen. When 10-odd lithium tantalate single crystals are produced in the iridium crucible, the crucible needs to be repaired due to its deformation, incurring about more than 500,000 yen each time. Such high unit price and repair cost result in a very high cost lithium tantalate single crystal. There is growing demand for the development of a method for producing a low cost lithium tantalate single crystal substantially free from crystal defects.

An object of this invention is to provide a method for manufacture of a low cost lithium tantalate single crystal substantially free from crystal defects.

Another object of this invention is to provide a method for the manufacture of a lithium tantalate single crystal having a very small amount of rhodium.

Another object of this invention is to provide a lithium tantalate single crystal particularly suitable for use as a substrate of a surface wave intermediate frequency filter for color television receivers.

The other objects and advantages of this invention will become apparent as the invention is more thoroughly discussed hereinafter.

Broadly described, according to this invention there is provided a method for production of a lithium tantalate single crystal substantially free from crystal defects, comprising the steps of preparing a melt consisting essentially of lithium tantalate in a platinum-rhodium crucible consisting essentially of 80 to 60 weight percent platinum and 20 to 40 weight percent rhodium, bringing a seed crystal into contact with the melt, and pulling the seed crystal away from the melt to permit growth of a single crystal. Preferably, the method of this invention is carried out in an oxidizing atmosphere such as the atmosphere or an oxygen gas. In detail, a lithium tantalate single crystal produced by the method of this invention has a very small amount of rhodium, a very low dislocation density, and an excellent temperature characteristic to a surface wave.

This invention will be further described by way of example by referring to the accompanying drawings in which.

Figure 6:
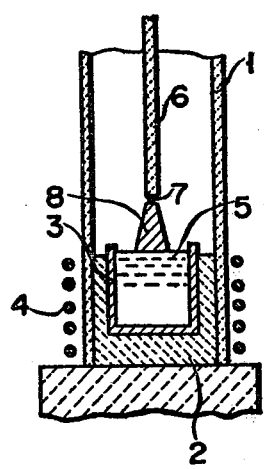
Figure 7:
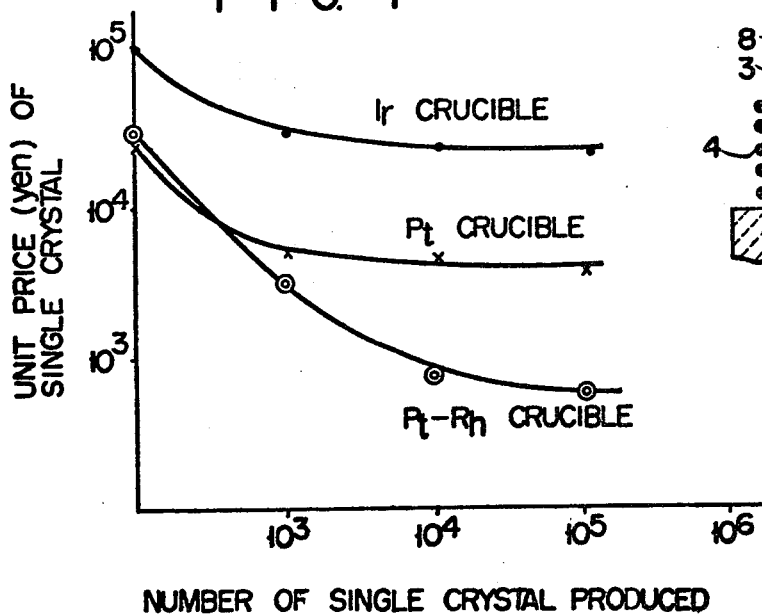

FIG. 6 is a diagrammatical cross-sectional view showing a single crystal production apparatus in which a single crystal is grown by a pulling-up method; and FIG. 7 is a graph showing a relation of the cost of a lithium tantalate single crystal to the number of single crystals as produced in three kinds of crucible: an iridium crucible, a platinum crucible and a 30 weight percent rhodium containing platinum-rhodium crucible.

A melt of lithium tantalate is obtained by mixing high purity lithium carbonate ($Li_2CO_3$) and tantalum pentoxide ($Ta_2O_5$) in a stoichiometric ratio or a congruent melt ratio and heating the raw material in a platinum-rhodium crucible. As required, an already melted raw material may be charged in the crucible. The lithium tantalate melt may be improved, as required, by addition of any suitable material. Preferably, a sintered mass of $Li_2CO_3$ and $Ta_2O_5$ is prepared beforehand and a melt is obtained by heating the sintered mass. $Li_2CO_3$ and $Ta_2O_5$ are mixed have a congruent melt ratio (i.e., Li/Ta=0.95) and sintered at 1200° C. for about five hours. The resultant sintered mass is press worked into discs for use as raw material. The raw material charged into the platinum-rhodium crucible is heated, for example, by a high frequency heating until it is sufficiently melted. The temperature at which the raw material is sufficiently melted is about 1700° C. The platinum-rhodium crucible can be conveniently used in an oxidizing atmosphere, for example, in the atmosphere or in an oxygen atmosphere.

After the melt in the platinum-rhodium crucible is adjusted to a temperature suitable to permit growth of a lithium tantalate single crystal, a seed crystal of lithium tantalate is contacted with the melt. Where a single crystal is grown by a pulling-up method, a temperature in the neighborhood of the melting point of lithium tantalate, or preferably about 1650° C., is believed suitable as the temperature of the melt. Although no particular restriction is made to the size of the seed crystal, it can be arbitrarily determined in connection with the size of the crucible.

The method for the growth of a lithium tantalate single crystal can be classified, according to the direction in which the seed crystal is pulled, as follows: a pulling-up method, pulling-down method and a laterally-pulling method. The pulling-up method is characterized by pulling a seed crystal upwardly. Czochralski method, Kyropoulos method, Edge-defined Film-fed Growth method and the version thereof are known as such a the Czochralski method and Kyropoulos method are single crystal growth techniques well known in the art and a technician skilled in the art will be able to easily put the method to practice by selecting the conditions involved. Edgedefined Film-fed Growth method is disclosed in U.S. Pat. No. 3, 591, 348 to Harold E. La Belle, Jr. The pulling-down method and laterally-pulling method are characterized by pulling a seed crystal downwardly and in a lateral direction, respectively, and each method is well known in the art.

Figure 1:
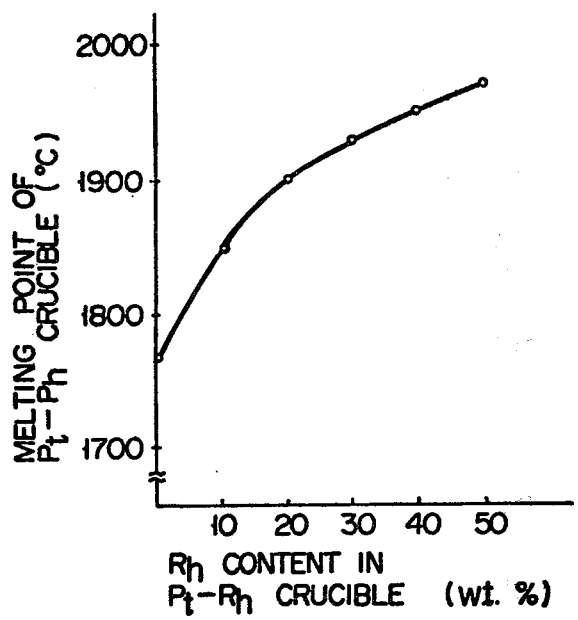
FIG. 1 is a graph showing a relation between the melting point of a platinum-rhodium crucible and the amount of rhodium in the crucible.
Figure 2:
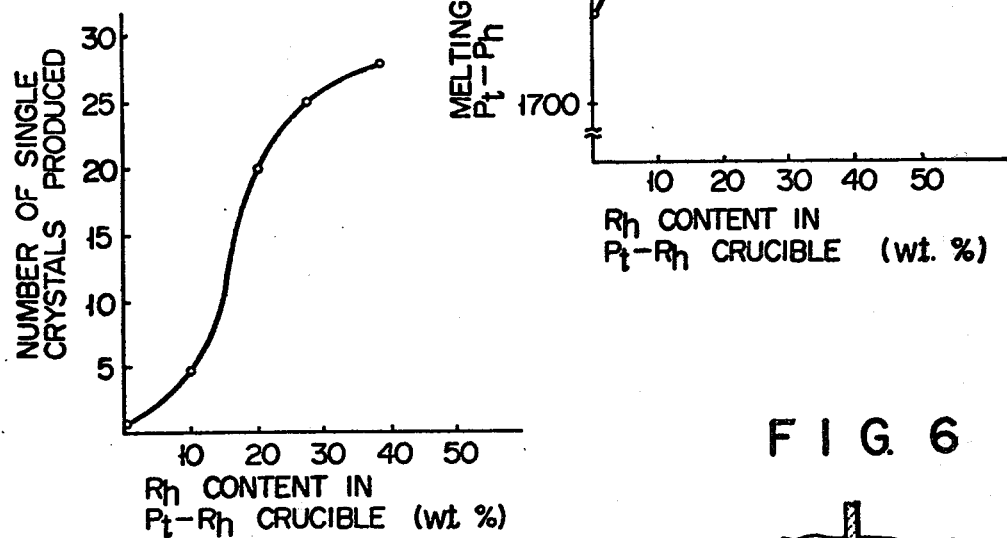
FIG. 2 is a graph showing the number of lithium tantalate single crystals with a diameter of 35 mm and a length of 100 mm as produced in a single platinum-rhodium crucible having a diameter of 80 mm, a height of 80 mm and a wall thickness of 2 mm.

It is important that the platinum-rhodium crucible used in the method of this invention be made essentially of from 80 to 60 weight percent platinum and 20 to 40 weight percent rhodium. As will be seen from FIG. 1 the melting point of the crucible becomes high as the content of rhodium in the crucible is increased. According to experiments conducted, the wall temperature of the crucible was at least 1850° C. when an intrafurnace temperature distribution effective to the growth of the lithium tantalate single crystal was obtained. At least 1880° C. is required, as the crucible wall temperature, to melt a raw material in a crucible of more than 60 mm in diameter. If the content of rhodium is less than 20 weight percent, the melting point of the crucible become less than 1900° C., shortening the service life of the crucible with an unpractical result. For a crucible having 20 to 40 weight percent of rhodium, a strikingly great number of lithium tantalate single crystals can be obtained, although dependent upon the wall thickness of the crucible, in comparison with a crucible having a lesser amount of rhodium. As will be evident from FIG. 2, for example, it is possible to obtain lithium tantalate single crystals about 4 to 6 times as great in number as those obtained when a crucible having 10 weight percent of rhodium is used. When, on the other hand, the content of rhodium exceeds 40 weight percent, the platinum-rhodium alloy becomes hard and brittle, making it difficult to work the crucible.

It has been found that the lithium tantalate single crystal produced by this method includes a very small amount of rhodium resulting from the platinum-rhodium crucible and that the rhodium very effectively acts upon the single crystal to improve its characteristics. Table I shows the impurity content of raw material for single crystals and the impurity content of each single crystal as obtained using an iridium crucible and a platinum-rhodium crucible including a 30 weight percent rhodium.

TABLE I

| | Content (ppm) of impurities in raw material and in single crystals obtained | | | | | | | | | | | |
|---|---|---|---|---|---|---|---|---|---|---|---|---|
| | Si | Mn | Mg | Fe | Al | Cu | Ca | Nb | Ti | Pb | Pt | Ph |
| Raw material | <1 | <1 | <1 | — | 3-10 | 1-3 | 1-3 | <10 | <3 | <10 | — | — |
| Single crystals grown in Ir crucible | — | — | <1 | 3-10 | 10-30 | 1-3 | 3-10 | — | — | — | — | — |
| Single crystals grown in Pt-Rh crucible | — | — | <1 | 3-10 | 3-10 | 1-3 | 3-10 | — | — | — | 100-300 | 100-300 |

Figure 3:
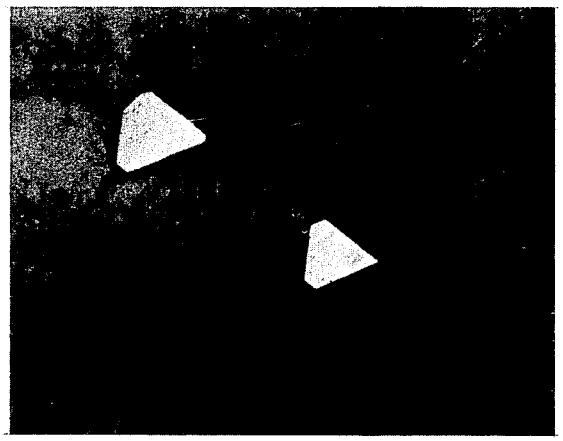
FIG. 3 is a microphotograph (amplification: ×200) showing platinum mixed as a metal impurity in a lithium tantalate single crystal.

As will be seen from Table 1, with the platinum-rhodium crucible including a 30 weight percent rhodium 100 to 300 ppm of platinum and 100 to 300 ppm of rhodium are mixed in the product single crystals. With crucibles having rhodium varied in a single of 20 to 40 weight percent, it has been found that a rhodium content in the resultant single crystals falls within a range of 90 to 700 ppm with no appreciable variation in the content of platinum. It is believed that platinum is mixed as a metal impurity in the crystal and exerts no effect upon the characteristic of the single crystal. This belief is supported from the microphotograph of the mixed platinum metal as shown in FIG. 3 and from the fact that $LiTaO_3$ and $LiTa_{0.5}Nb_{0.5}O_3$ single crystals as produced in a platinum crucible remains uncolored. It is also believed that rhodium is included as a crystal constituent element, not as a metal impurity, in the crystal site. As a result, lithium tantalate single crystals obtained by the method of this invention were colored light-brown or brown, and the dislocation density as well as the temperature coefficient to the propagation velocity of a surface wave was much improved.

Figure 4:
FIG. 4 is an X-ray topograph (amlification: ×100) showing a lithium tantalate single crystal as produced in a 30 weight percent rhodium containing crucible according to the method of this invention.
Figure 5:
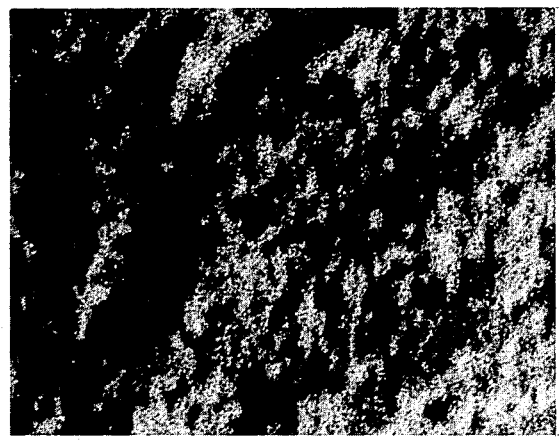
FIG. 5 is an X-ray topograph (amplification: ×100) showing a conventional lithium tantalate single crystal as produced in an iridium crucible.

The dislocation density of conventional lithium tantalate single crystals produced in an inert atmosphere in an iridium crucible using the pulling-up method is known to be $1 \times 10^5 - 1 \times 10^6$ $^{lines}$/cm$^2$ (Journal of Crystal Growth, volumes 24–25, PP 432 to 436, 1974). In contrast, the dislocation density of lithium tantalate single crystals produced in an oxidizing atmosphere in the platinum-rhodium crucible using the method of this invention was found to be $5 \times 10^2$ $^{lines}$/cm$^2$ or less. An increase in the content of rhodium in the crucible results in an decrease dislocation density of obtained single crystals. With the rhodium content of 40 weight percent some of single crystals are dislocation free and some suffer crystal defects other than dislocation. When the rhodium content is in a range of 20 to 30 weight percent, excellent single crystals fairly free from dislocation and the other crystal defects are obtained. For comparison in the dislocation density, an X-ray topography on the single crystal produced in a crucible having 30 weight percent of rhodium (this invention) and an X-ray topography on the single crystal produced in the conventional iridium crucible (prior art) are shown in FIGS. 4 and 5, respectively. The dislocation density of the single crystal as calculated from FIG. 4 is $3 \times 10^2$ $^{lines}$/cm$^2$. The fact that the dislocation density of lithium tantalate single crystals are prominently lower than those of the conventional counterparts is believed to be due to the fact that rhodium atoms mixed in the crystal enter in the crystal site and that oxygen defects can be restricted to a low level when single crystals are produced in an oxidizing atmosphere. The content of rhodium in the platinum-rhodium crucible must be 20 to 40 weight percent, even taking the crystal defects of obtained lithium tantalate single crystals into consideration. When in particular the rhodium content exceeds 40 weight percent, rhodium is melted into a melt in a greater amount and in consequence a constitutional supercooling tends to occur during the growth of single crystals and the crystal tends to grow in a cellular form, impairing its crystal quality.

To our surprise, the method of this invention much improves the temperature coefficient of a lithium tantalate single crystal to the propagation velocity of a surface wave as compared with that of a conventional one. A very advantageous result is obtained if the lithium tantalate single crystal is used for a substrate of an elastic surface wave device. The temperature coefficient, to the propagation velocity of a surface wave, of the lithium tantalate single crystal as produced by a conventional method was about 22 ppm for a substrate cut at an angle of 90° to the X-axis of the single crystal. In contrast, the temperature coefficient to the surface wave propagation velocity of a 300 ppm rhodium containing lithium tantalate single crystal as produced in a 30 weight percent rhodium containing Pt-Rh crucible according to the method of this invention was about 18 ppm under the identical conditions. It has been found that, although influenced by the amount of rhodium in a single crystal, the temperature coefficient to the surface wave propagation velocity of a single crystal as produced in a 20 to 40 weight percent rhodium containing crucible according to the method of this invention is about 18 ppm. Such about 20% improvement in the temperature characteristic of the single crystal to a surface wave has an important significance in that it permits this single crystal to be applied to a substrate of a surface wave intermediate frequency filter for color television receivers.

The method for the production of a lithium tantalate single crystal will be further described below.

EXAMPLE 108g of Li$_2$CO$_3$ and 662.8g of Ta$_2$O$_5$ were mixed in a congruent melt ratio (Li/Ta=0.95) and sintered at 1200° C. for 5 hours. The resultant sintered mass was press worked into discs. The discs were charged as raw material into a platinum-rhodium crucible and melted by a high frequency heating. The crucible was cylindrical in configuration with a bottom, had a diameter of 80 mm, a height of 80 mm and a wall thickness of 1 mm, and is made of 70 weight percent of platinum and 30 weight percent of rhodium. FIG. 6 shows a schematic structure of a crystal production apparatus used. The crucible 3 was placed, through a babble alumina 2, in a furnace body 1 made of an alumina tube. The raw material was heated through a high frequency heating coil 4 to about 1700° C. to obtain a melt 5. In order to maintain the melt 5 at a temperature of about 1650° C. an adjustment was made to obtain a suitable temperature gradient in the furnace body 1. A 5 mm × 5 mm × 7 mm seed crystal 7 carried on the forward end of an alumina holder 6 was contacted with the melt 5 and then pulled up at the rate of 5 mm/hr. After about 8 hours a lithium tantalate single crystal 8 with a diameter of 40 mm and a length of 40 mm was obtained. During the growth of the single crystal, oxygen was supplied at the rate of 1.5 l/min into the furnace. The production of single crystals was repeated by supplying into the crucible a raw material corresponding to the weight of the single crystal obtained. The crucible suffered little deformation and wear until 20 single crystals were produced under the identical conditions, and no repair was needed.

This invention is economically advantageous over a conventional method, since the method of this invention uses a durable platinum-rhodium crucible of low unit cost. Table II shows a comparison in the economical advantage of three kinds of crucibles each having a diameter of 80 mm, a hight of 80 mm and a wall thickness of 1.5 mm.

TABLE II

| | Economical Advantage of Crucibles | | | |
|---|---|---|---|---|
| | Price (Yen) | Unit Price (Yen/g) | Cost of Repairing (Yen) | Repeatability* |
| Ir Crucible | 7,000,000 | 8,000 | 700,000 | 30 |
| Pt Crucible | 1,850,000 | 2,200 | 10,000 | 2 |
| 60% Pt-40% Rh Crucible | 2,600,000 | 4,000 | 10,000 | 20 |

*Repeatability means the number of times at which a single crystal with a diameter of 40 mm and a length of 40 mm is produced with good repeatability, without the necessity of repairing a single crucible (the intrafurnace structure is under identical conditions.)

FIG. 7 shows the results of a comparison in the unit costs of lithium tantalate single crystals (having a diameter of 40 mm and a length of 40 mm) mass-produced in the kinds of crucibles (having a diameter of 80 mm, a height of 80 mm and wall thickness of 1.5 mm), each of which was repaired and sequentially replaced by a corresponding crucible when the crucible needs replacement. As will be evident from FIG. 7, according to this invention using a 40 weight percent rhodium containing platinum-rhodium crucible the production cost of a single crystal was able to be reduced to about 1/10 in comparison with a conventional method using a platinum crucible and to below 1/40 in comparison with a conventional method using an iridium crucible.

What we claim is:

1. A method for producing a lithium tantalate single crystal comprising
    establishing a melt under an oxidizing atmosphere consisting essentially of lithium tantalate in a platinumrhodium crucible consisting essentially of between 80% by weight and about 70% platinum and between 20% and about 30% rhodium, said melt being at a temperature of about the melting point of lithium tantalate,
    contacting a seed crystal of lithium tantalate with said melt, and
    pulling the seed crystal away from the melt to grow a lithium tantalate single crystal.

2. The method of claim 1 wherein said melt in contact with said seed crystal is at a temperature of about 1650° C.

3. The method of claim 1 wherein said single crystal contains a very small amount of rhodium.

4. The method of claim 1 wherein said single crystal has a temperature coefficient to the surface wave propogation velocity of about 18 ppm for a portion cut at an angle of 90° to the X-axis of the single crystal.

5. A method according to claim 1, in which said lithium tantalate single crystal is grown by a pullingup method.

6. A method according to claim 5, in which a lithium tantalate single crystal is grown by a Czochralski method.

7. A method according to claim 1, in which said lithium tantalate single crystal is grown by a pulling-down method.

8. A method according to claim 1, in which said lithium tantalate single crystal is grown by a laterally pulling method.

9. A method according to claim 1, in which said rhodium in said lithium tantalate single crystal is present as a crystal constituent element in a crystal site.

10. A method according to claim 1, in which said lithium tantalate single crystal contains 90 to 700 ppm of rhodium.

11. A method according to claim 10, in which said lithium tantalate single crystal contains 100 to 300 ppm of rhodium.

12. A method according to claim 1, in which said platinum-rhodium crucible consists essentially of 70% weight percent platinum and 30 weight percent rhodium.

13. A method according to claim 1, in which said lithium tantalate single crystal has a dislocation density of less than $5 \times 10^{2 \, lines}/cm^2$.

14. A method according to claim 3, in which said lithium tantalate single crystal has a dislocation density of less than $5 \times 10^{2 \, lines}/cm^2$.

* * * * *

UNITED STATES PATENT AND TRADEMARK OFFICE
CERTIFICATE OF CORRECTION

PATENT NO. : 4,144,117
DATED : March 13, 1979
INVENTOR(S) : TSUGUO FUKUDA et al

It is certified that error appears in the above-identified patent and that said Letters Patent are hereby corrected as shown below:

Column 3, line 54: rewrite "version" as ---versions---.

Column 3, line 55: after "such a", replace "the" with ---method. The---.

Column 3, line 67: before "20", insert ---from---.

Column 7, lines 7-8: rewrite "platinumrhodium" as ---platinum-rhodium---.

Signed and Sealed this

Second Day of October 1979

[SEAL]

Attest:

RUTH C. MASON
Attesting Officer

LUTRELLE F. PARKER
Acting Commissioner of Patents and Trademarks